(12) United States Patent
Hornstein et al.

(10) Patent No.: US 9,559,666 B2
(45) Date of Patent: Jan. 31, 2017

(54) METHOD AND CIRCUIT ARRANGEMENT FOR ACTUATING A SEMICONDUCTOR SWITCH

(71) Applicant: Conti Temic microelectronic GmbH, Nuremberg (DE)

(72) Inventors: Christoph Hornstein, Nuremberg (DE); Ulrich Bley, Rackwitz (DE); Kai Kuehnen, Nuremberg (DE); Eric Taistra, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 0 days.

(21) Appl. No.: 14/432,662

(22) PCT Filed: Oct. 15, 2013

(86) PCT No.: PCT/EP2013/071506
§ 371 (c)(1),
(2) Date: Mar. 31, 2015

(87) PCT Pub. No.: WO2014/063957
PCT Pub. Date: May 1, 2014

(65) Prior Publication Data
US 2015/0222250 A1    Aug. 6, 2015

(30) Foreign Application Priority Data
Oct. 22, 2012    (DE) .......................... 10 2012 219 240

(51) Int. Cl.
*H03K 3/00*        (2006.01)
*H03K 3/012*      (2006.01)
(Continued)

(52) U.S. Cl.
CPC ................ *H03K 3/012* (2013.01); *H03K 4/02* (2013.01); *H03K 17/082* (2013.01)

(58) Field of Classification Search
CPC ............ H03K 3/00; H03K 3/01; H03K 3/012; H03K 4/02; H03K 17/08; H03K 17/082
(Continued)

(56) References Cited

U.S. PATENT DOCUMENTS 6,011,416 A * 1/2000 Mizuno .............. H03K 17/0822
                                                            327/108
6,556,407 B2    4/2003 Brando et al. ................. 361/100
(Continued)

FOREIGN PATENT DOCUMENTS

CN        101499791 A       8/2009  .............. H02M 1/00
DE         4301605 C1        5/1994  .............. H02M 1/08
(Continued)

OTHER PUBLICATIONS

International Search Report and Written Opinion, Application No. PCT/EP2013/071506, 10 pages, Feb. 17, 2014.
European Office Action, Application No. 13777272.9, 6 pages.

*Primary Examiner* — William Hernandez
(74) *Attorney, Agent, or Firm* — Slayden Grubert Beard PLLC

(57) ABSTRACT

A method for actuating a controllable semiconductor switch by switching the switch on an off in phases in a controlled manner using a control signal is disclosed. The method includes starting a time measurement at the beginning of at least one phase of the phase-wise on-and-off switching procedure to ascertain a time duration, wherein the time measurement is continued until a phase following the at least one phase of the phase-wise on-and-off switching procedure begins. The ascertained time duration is compared with a specified maximal time duration. If the ascertained time duration exceeds the specified maximal time duration, the semiconductor switch is actuated such that the semiconductor switch is switched into a specified operating state.

15 Claims, 2 Drawing Sheets

(51) Int. Cl.
 *H03K 4/02* (2006.01)
 *H03K 17/082* (2006.01)

(58) Field of Classification Search
 USPC ............... 327/108, 109, 110, 111, 112, 172,
  176,327/574, 581; 326/82, 83
 See application file for complete search history.

(56) References Cited

U.S. PATENT DOCUMENTS

| | | | |
|---|---|---|---|
| 7,647,125 B2 | 1/2010 | Melanson | 700/14 |
| 8,593,127 B2 * | 11/2013 | Odell | H02M 1/12 323/207 |
| 8,957,723 B2 * | 2/2015 | Zoels | H03K 17/18 324/762.09 |
| 9,309,849 B2 | 4/2016 | Tanabe et al. | |
| 2008/0098991 A1 | 5/2008 | Eddy | 123/504 |
| 2009/0027096 A1 | 1/2009 | Mourrier et al. | 327/170 |
| 2011/0241738 A1 | 10/2011 | Tamaoka | 327/109 |
| 2012/0170166 A1 | 7/2012 | Nagasawa et al. | 361/92 |
| 2012/0206123 A1 | 8/2012 | Mulligan et al. | 323/313 |

FOREIGN PATENT DOCUMENTS

| | | | | |
|---|---|---|---|---|
| DE | 19855604 C1 | 6/2000 | ........... | H03K 17/042 |
| JP | 11182310 A | 7/1999 | | |
| JP | 2012202404 A | 10/2012 | | |
| WO | 2008/113308 A1 | 9/2008 | ............... | H02H 6/00 |
| WO | 2014/063957 A1 | 5/2014 | ........... | H03K 17/082 |

* cited by examiner

METHOD AND CIRCUIT ARRANGEMENT FOR ACTUATING A SEMICONDUCTOR SWITCH

CROSS-REFERENCE TO RELATED APPLICATIONS

This application is a U.S. National Stage Application of International Application No. PCT/EP2013/071506 filed Oct. 15, 2013, which designates the United States of America, and claims priority to DE Application No. 10 2012 219 240.9 filed Oct. 22, 2012, the contents of which are hereby incorporated by reference in their entirety.

TECHNICAL FIELD

The invention relates to a method and a circuit arrangement for actuating a controllable semiconductor switch.

BACKGROUND

DE 43 01 605 C1 discloses a method and an arrangement for monitoring the switching-on and switching-off of a controllable power semiconductor component in a power electronics circuit. Control signals for the power semiconductor component are supplied, in galvanically decoupled fashion, to a gate electrode. In the case of an actuation signal for switching on the power semiconductor component, counting signals are formed from level changes of the signal applied to the gate electrode and the level changes at an output electrode during switchover of the power semiconductor component. The counting signals are summated and compared with a preset count value assigned to the problem-free mode of operation of the power semiconductor component. In the event of a difference between the sum of the counting signals and the preset count value, an error is communicated.

SUMMARY

One embodiment provides a method for actuating a controllable semiconductor switch using a control signal by controlled, phase-based switching-on and switching-off, wherein the method comprises the following method steps: starting a time measurement at the beginning of at least one phase of the phase-based switching-on and switching off in order to determine a duration, wherein the time measurement is continued until a phase following the at least one phase of the phase-based switching-on and switching off begins, comparing the determined duration with a preset maximum duration, and if the determined duration exceeds the preset maximum duration, actuating the semiconductor switch in such a way that the semiconductor switch is switched into a preset operating state.

In a further embodiment, the semiconductor switch has a control connection, an input current connection and an output current connection and is controllable via the control connection, and wherein the control signal is a pulse-width-modulated control signal, and wherein the actuation of the semiconductor switch additionally takes place by means of a driver circuit unit, wherein the driver circuit unit has a first controllable driver switch, which is arranged between the control connection of the semiconductor switch and a first, negative supply voltage connection, and a second controllable driver switch, which is arranged between the control connection of the semiconductor switch and a second, positive supply voltage connection, and the actuation of the semiconductor switch takes place by controlled, phase-based switching-on and switching-off of the first driver switch and the second driver switch, and wherein the method additionally comprises the following method steps: identifying a first type or a second type, which is different than the first type, of signal edge in the control signal, measuring an input connection voltage at the input current connection of the semiconductor switch, comparing the measured input connection voltage with a reference input voltage, measuring a control connection voltage at the control connection of the semiconductor switch, comparing the measured control connection voltage with a reference control voltage, wherein the actuation of the semiconductor switch takes place by controlled, phase-based switching-on and switching-off of the first driver switch and the second driver switch depending on: the identified, directly preceding first type or second type of signal edge in the control signal and/or the comparison result between the presently measured input connection voltage and the reference input voltage and/or the comparison result between the presently measured control connection voltage and the reference control voltage.

In a further embodiment, the actuation of the semiconductor switch takes place by controlled, phase-based switching-on and switching-off of the first driver switch and the second driver switch optionally with a first preset actuation voltage, a second preset actuation voltage, a first preset actuation current, a second preset actuation current, which is independent of the first preset actuation current, a third preset actuation current, a fourth preset actuation current, which is independent of the third preset actuation current, or a fifth preset actuation current, which is lower than the first preset actuation current and the second preset actuation current.

In a further embodiment, in a first phase of switching-on of the semiconductor switch, actuation of the second driver switch with the third preset actuation current and starting of a first time measurement at the beginning of the first phase of switching-on in order to determine a first duration in the case of an identified, directly preceding first type of signal edge in the control signal takes place, and wherein the first time measurement is continued as long as the presently measured control connection voltage does not exceed the reference control voltage, and wherein, if the determined first duration exceeds a first preset maximum duration, the second driver switch is switched off and the first driver switch is actuated by the second preset actuation current.

In a further embodiment, in a second phase of switching-on of the semiconductor switch, actuation of the second driver switch by the fourth actuation current and starting of a second time measurement at the beginning of the second phase of switching-on in order to determine a second duration in the event of the reference control voltage being exceeded by the presently measured control connection voltage takes place, and wherein the second time measurement is continued as long as the presently measured input connection voltage does not fall below the reference input voltage, and wherein, if the determined second duration exceeds a second preset maximum duration, the second driver switch is switched off and the first driver switch is actuated by the fifth preset actuation current.

In a further embodiment, in the second phase of switching-on, the first time measurement is continued if the presently measured control connection voltage falls below the reference control voltage again, and wherein, if the determined first duration exceeds the first preset maximum duration, the second driver switch is switched off and the first driver switch is actuated by the second preset actuation current.

In a further embodiment, in a third phase of switching-on of the semiconductor switch, actuation of the second driver switch by the second preset actuation voltage takes place in the event that the presently measured input connection voltage falls below the reference input voltage, and wherein, in the third phase of switching-on, the input connection voltage is measured repeatedly and compared with the reference input voltage, and if the repeatedly measured input connection voltage exceeds the reference input voltage, the second driver switch is switched off and the first driver switch is actuated by the fifth preset actuation current.

In a further embodiment, in the third phase of switching-on, the first time measurement is continued if the presently measured control connection voltage falls below the reference control voltage again, and wherein, if the determined first duration exceeds the first preset maximum duration, the second driver switch is switched off and the first driver switch is actuated by the second preset actuation current.

In a further embodiment, the first driver switch is actuated by the fifth preset actuation current for a fifth preset duration, and wherein, once the fifth preset duration has been reached, the control connection voltage is measured repeatedly and compared with the reference control voltage.

In a further embodiment, the control connection is coupled to the negative supply voltage connection via an electrical resistor if the repeatedly measured control connection voltage does not fall below the reference control voltage once the fifth preset duration has been reached, and wherein the first driver switch is actuated by the first preset actuation voltage if the repeatedly measured control connection voltage does not exceed the reference control voltage and, in addition, a directly preceding second type of signal edge is identified in the control signal.

In a further embodiment, in a first phase of switching-off of the semiconductor switch, actuation of the first driver switch by the first preset actuation current and starting of a third time measurement at the beginning of the first phase of switching-off in order to determine a third duration in the case of an identified, directly preceding second type of signal edge in the case of the control signal takes place, and wherein the third time measurement is continued as long as the presently measured control connection voltage does not fall below the reference control voltage, and wherein, if the determined third duration exceeds a third preset maximum duration, the control connection is coupled to the negative supply voltage connection via an electrical resistor.

In a further embodiment, in a second phase of switching-off of the semiconductor switch, actuation of the first driver switch by the second preset actuation current and starting of a fourth time measurement at the beginning of the second phase of switching-off of the semiconductor switch in order to determine a fourth duration in the event that the reference input voltage is exceeded by the presently measured input connection voltage takes place, and wherein the fourth time measurement is continued as long as the presently measured control connection voltage does not fall below the reference control voltage, and wherein, if the determined fourth duration exceeds a fourth preset maximum duration, the control connection is coupled to the negative supply voltage connection via an electrical resistor.

In a further embodiment, in a third phase of switching-off of the semiconductor switch, actuation of the first driver switch by the first preset actuation voltage in the event of the presently measured control connection voltage falling below the reference control voltage takes place.

Another embodiment provides a circuit arrangement for actuating a controllable semiconductor switch using a control signal, wherein the circuit arrangement comprises the following features: an actuation unit for actuating the semiconductor switch by controlled, phase-based switching-on and switching-off, a time measurement unit for starting a time measurement at the beginning of at least one phase of the phase-based switching-on and switching-off in order to determine a duration, wherein the time measurement is continued until a phase following the at least one phase of the phase-based switching-on and switching-off begins, a comparison unit for comparing the determined duration with a preset maximum duration, wherein the actuation unit is designed to actuate the semiconductor switch in such a way that the semiconductor switch is switched to a preset operating state if the determined duration exceeds the preset maximum duration.

In a further embodiment, the semiconductor switch has a control connection, an input current connection and an output current connection and is controllable via the control connection, and wherein the control signal is a pulse-width-modulated control signal, and wherein the circuit arrangement additionally has the following features: a driver circuit unit having at least one controllable driver switch, a first comparison unit for measuring an input connection voltage at the input current connection of the semiconductor switch and for comparing the measured input connection voltage with a reference input voltage, a second comparison unit for measuring a control connection voltage at the control connection of the semiconductor switch and for comparing the measured control connection voltage with a reference control voltage, and wherein the actuation unit is designed to actuate the semiconductor switch by controlled, phase-based switching-on and switching-off of the at least one driver switch.

BRIEF DESCRIPTION OF THE DRAWINGS

Embodiments of the invention are explained in more detail below with reference to the attached figures, in which.

DETAILED DESCRIPTION

Figure 1:
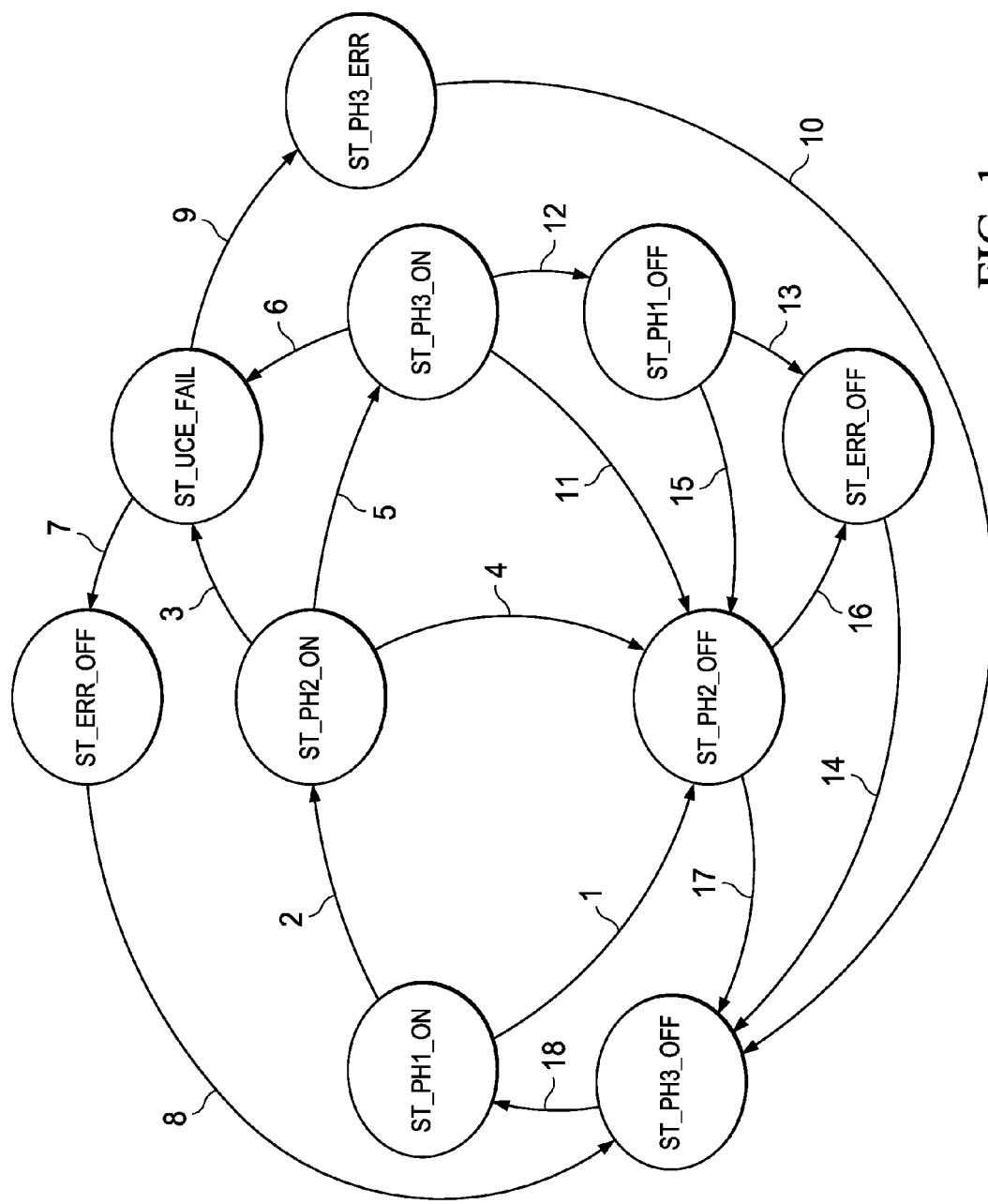
FIG. 1 shows a schematic illustration of a method for actuating a semiconductor switch having a control connection, an input current connection and an output current connection and controllable via the control connection, in accordance with one embodiment.

Embodiments of the invention provide a method and a circuit arrangement for actuating a controllable semiconductor switch which enable increased operational reliability for the operation of the semiconductor switch.

A method for actuating a controllable semiconductor switch using a control signal by means of controlled, phase-based switching-on and switching-off has the following steps in accordance with one aspect of the invention. Starting of a time measurement at the beginning of at least one phase of the phase-based switching-on and switching-off in order to determine a duration takes place, wherein the time measurement is continued at least until a phase following the at least one phase of the phase-based switching-on and switching-off begins. In addition, a comparison of the determined duration with a preset maximum duration takes place. If the determined duration exceeds the preset maximum duration, actuation of the semiconductor switch takes place in such a way that the semiconductor switch is switched into a preset operating state.

A phase-based switching-on and switching-off is in this case understood to mean stepwise switching-on and switching-off of the semiconductor switch, i.e. the switching-on and switching-off of the semiconductor switch has at least two steps which are temporally different from one another and which have independent actuation parameters from one another, as will be explained further below.

In this case, switching-on or switching-off of the semiconductor switch means a respective individual switch-on or switch-off operation of the semiconductor switch, wherein, in a switch-on operation, the semiconductor switch transfers from an initial open switching state to a closed switching state and, in a switch-off operation, the semiconductor switch transfers from an initially closed switching state to an open switching state.

The method in accordance with the mentioned embodiment enables increased operational reliability for the operation of the semiconductor switch. This takes place in particular by the starting of a time measurement at the beginning of at least one phase of the phase-based switching-on and switching-off and the continuation of the time measurement until a phase following the at least one phase of the phase-based switching-on and switching-off begins, the comparison of the determined duration with a preset maximum duration and the switching of the semiconductor switch into a preset operating state in the event that the preset maximum duration is exceeded. Therefore, the duration of at least one of the phases of the phase-based switching-on and switching-off is determined and compared with a preset maximum duration and, in the event that the preset maximum duration is exceeded, the semiconductor switch is switched into a preset operating state. In this case, it is assumed that it is possible to conclude from the preset maximum duration being exceeded that there is a fault state and in this case the semiconductor switch should be brought into a safe operating state in the form of the preset operating state.

The mentioned method therefore enables an increased degree of robustness in terms of faults and reliability. The monitoring of the switching behavior and the fault handling increases the reliability by reducing the probability of failure of the semiconductor switch. In addition, safety requirements for safety-relevant electrical or electronic systems can be met, in particular in vehicle applications. In addition, extended diagnosis possibilities are provided.

The preset operating state is preferably a switched-off operating state of the semiconductor switch. This operating state typically represents a safe operating state in the event of a malfunction.

In one embodiment, the semiconductor switch has a control connection, an input current connection and an output current connection and is controllable via the control connection. In addition, the control signal is a pulse-width-modulated control signal. The actuation of the semiconductor switch in the mentioned embodiment additionally takes place by means of a driver circuit unit, wherein the driver circuit unit has a first controllable driver switch, which is arranged between the control connection of the semiconductor switch and a first, negative supply voltage connection, and a second controllable driver switch, which is arranged between the control connection of the semiconductor switch and a second, positive supply voltage connection, and the actuation of the semiconductor switch takes place by controlled, phase-based switching-on and switching-off of the first driver switch and the second driver switch. In this embodiment, the method furthermore has the following method steps. Identification of a first type or a second type, which is different than the first type, of signal edge in the case of the control signal takes place. The first type of signal edge is, for example, a rising signal edge and the second type of signal edge is a falling signal edge. In addition, a measurement of an input connection voltage at the input current connection of the semiconductor switch and a comparison of the measured input connection voltage with a reference input voltage take place. In this case, the input connection voltage at the input current connection of the semiconductor switch is preferably measured based on the voltage potential at the output current connection of the semiconductor switch. In this case, the input connection voltage is a potential difference between the voltage potential at the input current connection and the voltage potential at the output current connection of the semiconductor switch. In addition, a measurement of a control connection voltage at the control connection of the semiconductor switch and a comparison of the measured control connection voltage with a reference control voltage take place. In this case, the control connection voltage is measured at the control connection of the semiconductor switch, preferably based on the voltage potential at the output current connection of the semiconductor switch. In this case, the control connection voltage is a potential difference between the voltage potential at the control connection and the voltage potential at the output current connection of the semiconductor switch. The actuation of the semiconductor switch in this embodiment takes place by means of controlled, phase-based switching-on and switching-off of the first and second driver switches depending on the identified, directly preceding first type or second type of signal edge in the case of the control signal and/or depending on the comparison result between the presently measured input connection voltage and the reference input voltage and/or depending on the comparison result between the presently measured control connection voltage and the reference control voltage.

In particular, the actuation of the semiconductor switch can in this case take place by controlled, phase-based switching-on and switching-off of the first and second driver switches optionally with a first preset actuation voltage, a second preset actuation voltage, a first preset actuation current, a second preset actuation current which is independent of the first preset actuation current, a third preset actuation current, a fourth preset actuation current, which is independent of the third preset actuation current or a fifth preset actuation current which is lower than the first present actuation current and the second preset actuation current. For example, the second preset actuation current is lower than the first preset actuation current and the fourth preset actuation current is lower than the third preset actuation current.

In the last-mentioned embodiments, the switching operation of the semiconductor switch is therefore divided into a plurality of phases, wherein the reloading of the control connection of the semiconductor switch takes place depending on the respective switching state in specific switching phases via regulated current sources, whose current value can be configured individually for each phase, and in the remaining switching phases via the application of preset voltages, as will be explained further below. With these methods, the switching losses can be markedly reduced in comparison with driver circuits in which the control connection is fixedly clamped to a switch-on or switch-off voltage via a series resistor.

In a further embodiment of the method, in a first phase of switching-on of the semiconductor switch, actuation of the second driver switch with the third preset actuation current and starting of a first time measurement at the beginning of the first phase of switching-on in order to determine a first duration in the case of an identified, directly preceding first type of signal edge in the control signal takes place. The first time measurement is continued as long as the presently measured control connection voltage does not exceed the reference control voltage. If the determined first duration exceeds a first preset maximum duration, the second driver switch is switched off and the first driver switch is actuated by the second preset actuation current.

In addition, in a further configuration, in a second phase of switching-on of the semiconductor switch, actuation of the second driver switch by the fourth actuation current, ending of the first time measurement and starting of a second time measurement at the beginning of the second phase of switching-on in order to determine a second duration in the event of the reference control voltage being exceeded by the presently measured control connection voltage takes place. The second time measurement is continued as long as the presently measured input connection voltage does not fall below the reference input voltage. If the determined second duration exceeds a second preset maximum duration, the second driver switch is switched off and the first driver switch is actuated by the fifth preset actuation current.

In the second phase of switching-on, the first time measurement can additionally be continued if the presently measured control connection voltage falls below the reference control voltage again. If the determined first duration exceeds the first preset maximum duration, the second driver switch is switched off and the first driver switch is actuated by the second preset actuation current.

In a third phase of switching-on of the semiconductor switch, actuation of the second driver switch by the second preset actuation voltage and ending of the second time measurement preferably takes place in the event that the presently measured input connection voltage falls below the reference input voltage. In this case, in the third phase of switching-on, the input connection voltage is measured repeatedly and compared with the reference input voltage. If the repeatedly measured input connection voltage exceeds the reference input voltage, the second driver switch is switched off and the first driver switch is actuated by the fifth preset actuation current.

In the third phase of switching-on, the first time measurement can additionally be continued if the presently measured control connection voltage falls below the reference control voltage again. If the determined first duration exceeds the first preset maximum duration, in this case the second driver switch is switched off and the first driver switch is actuated by the second preset actuation current.

In a further embodiment of the method, the first driver switch is actuated by the fifth preset actuation current for a fifth preset duration. Once the fifth preset duration has been reached, the control connection voltage is measured repeatedly and compared with the reference control voltage.

In this case, the control connection is preferably coupled or electrically connected to the negative supply voltage connection via an electrical resistor if the repeatedly measured control connection voltage does not fall below the reference control voltage once the fifth preset duration has been reached. If the repeatedly measured control connection voltage does not exceed the reference control voltage, on the other hand, and additionally a directly preceding second type of signal edge in the control signal is identified, the first driver switch is actuated by the first preset actuation voltage.

In a further configuration of the method, in a first phase of switching-off of the semiconductor switch, actuation of the first driver switch by the first preset actuation current and starting of a third time measurement at the beginning of the first phase of switching-off in order to determine a third duration in the case of an identified, directly preceding second type of signal edge in the case of the control signal takes place. The third time measurement is continued as long as the presently measured control connection voltage does not fall below the reference control voltage. If the determined third duration exceeds a third preset maximum duration, the control connection is coupled or electrically connected to the negative supply voltage connection via an electrical resistor.

Preferably, in a second phase of switching-off of the semiconductor switch, actuation of the first driver switch by the second preset actuation current and starting of a fourth time measurement at the beginning of the second phase of switching-off of the semiconductor switch in order to determine a fourth duration in the event that the reference input voltage is exceeded by the presently measured input connection voltage takes place. The fourth time measurement is continued as long as the presently measured control connection voltage does not fall below the reference control voltage. If the determined fourth duration exceeds a fourth preset maximum duration, the control connection is coupled or electrically connected to the negative supply voltage connection via an electrical resistor.

In a further embodiment of the method, in a third phase of switching-off of the semiconductor switch, actuation of the first driver switch by the first preset actuation voltage in the event of the presently measured control connection voltage falling below the reference control voltage takes place.

The mentioned embodiments, which relate to a three-stage or three-phase switch-on and switch-off of the semiconductor switch, advantageously enable fault identification and a corresponding response to faults by temporal monitoring of the above-explained switching phases. Thus, the operational reliability of the semiconductor switch is increased to a particular extent.

In addition, the invention relates to a circuit arrangement for actuating a controllable semiconductor switch using a control signal. The circuit arrangement has an actuation unit for actuating the semiconductor switch by controlled, phase-based switching-on and switching-off. In addition, the circuit arrangement has a time measurement unit for starting a time measurement at the beginning of at least one phase of the phase-based switching-on and switching-off in order to determine a duration, wherein the time measurement is continued at least until a phase following the at least one phase of the phase-based switching-on and switching-off begins. Furthermore, the circuit arrangement has a comparison unit for comparing the determined duration with a preset maximum duration. The actuation unit is designed to actuate the semiconductor switch in such a way that the semiconductor switch is switched into a preset operating state if the determined duration exceeds the preset maximum duration.

The circuit arrangement has the advantages already mentioned in connection with the corresponding method, which advantages are not listed again at this juncture in order to avoid repetition. In addition, the circuit arrangement is particularly suitable for implementation of the method according to the invention, wherein this can also apply to the configurations and developments. In addition, the circuit arrangement can have further suitable apparatuses or components.

In one embodiment, the semiconductor switch has a control connection, an input current connection and an output current connection and is controllable via the control connection. The control signal is in this case a pulse-width-modulated control signal. The circuit arrangement also has a driver circuit unit having at least one controllable driver switch, a first comparison unit for measuring an input connection voltage at the input current connection of the semiconductor switch and for comparing the measured input connection voltage with a reference input voltage, and a second comparison unit for measuring a control connection voltage at the control connection of the semiconductor switch and for comparing the measured control connection voltage with a reference control voltage. In the mentioned embodiment, the actuation unit is designed for actuating the semiconductor switch by means of controlled, phase-based switching-on and switching-off of the at least one driver switch.

The semiconductor switch is in the form of, for example, an IGBT, in particular an n-channel IGBT, or a MOSFET, in particular an re-channel MOSFET.

The driver circuit unit is, for example, a half-bridge circuit unit.

In addition, the invention relates to a power converter for providing at least one phase current for an electric machine, wherein the power converter has a circuit arrangement in accordance with one of the mentioned embodiments for providing the phase current.

The invention furthermore relates to a drive apparatus for driving a vehicle comprising an electric machine, wherein the drive apparatus has a circuit arrangement in accordance with one of the mentioned embodiments for providing at least one phase current for the electric machine.

FIG. 1 shows a schematic illustration of a method for actuating a semiconductor switch having a control connection, an input current connection and an output current connection and controllable via the control connection using a pulse-width-modulated control signal and by means of a driver circuit unit in accordance with one embodiment. The semiconductor switch in the embodiment shown is an n-channel IGBT or an n-channel MOSFET.

In the embodiment shown, during fault-free operation the method comprises three switch-on phases of the semiconductor switch, which are denoted by ST_PH1_ON, ST_PH2_ON and ST_PH3_ON, respectively, and three switch-off phases of the semiconductor switch, which are denoted by ST_PH1_OFF, ST_PH2_OFF and ST_PH3_OFF, respectively. The mentioned switching phases will be explained in more detail below.

The driver circuit unit has a first controllable driver switch, which is arranged between the control connection of the semiconductor switch and a first, negative supply voltage connection, and a second controllable driver switch, which is arranged between the control connection of the semiconductor switch and a second, positive supply voltage connection.

In the embodiment shown, identification of a first type or a second type, which is different than the first type, of signal edge in the pulse-width-modulated control signal takes place. This first type of signal edge is, for example, a rising signal edge and the second type of signal edge is a falling signal edge. In addition, a measurement of an input connection voltage at the input current connection of the semiconductor switch and a comparison of the measured input connection voltage with a reference input voltage take place. In addition, a measurement of a control connection voltage at the control connection of the semiconductor switch and a comparison of the measured control connection voltage with a reference control voltage takes place. The actuation of the semiconductor switch in this embodiment takes place by controlled, phase-based switching-on and switching-off of the first and second driver switches depending on the identified, directly preceding first type or second type of signal edge in the control signal and/or depending on the comparison result between the presently measured input connection voltage and the reference input voltage and/or depending on the comparison result between the presently measured control connection voltage and the reference control voltage.

Figure 2:
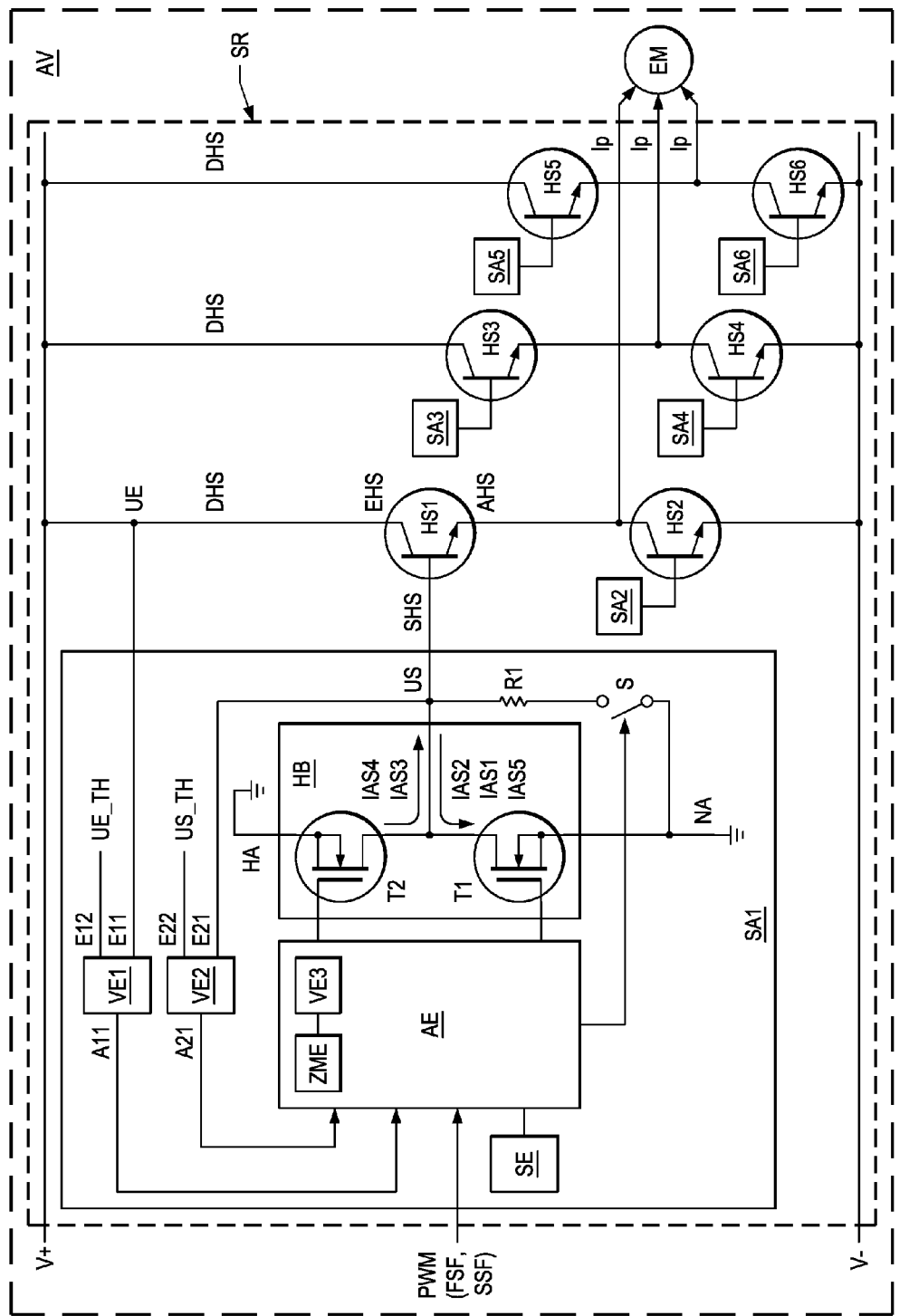
FIG. 2 shows a drive apparatus for driving an electric or hybrid vehicle comprising an electric machine and a power converter in a schematic illustration in accordance with one embodiment.

The actuation of the semiconductor switch takes place in this case by controlled, phase-based switching-on and switching-off of the first and second driver switches optionally with a first preset actuation voltage, a second preset actuation voltage, a first preset actuation current IAS1, a second preset actuation current IAS2, which is independent of the first preset actuation current IAS1, a third preset actuation current IAS3, a fourth preset actuation current IAS4, which is independent of the third preset actuation current IAS3 or a fifth preset actuation current IAS5 which is lower than the first preset actuation current IAS1 and the second preset actuation current IAS2. For example, the second preset actuation current IAS2 is lower than the first preset actuation current IAS1, and the fourth preset actuation current IAS4 is lower than the third preset actuation current IAS3. The mentioned actuation currents are illustrated in FIG. 2.

In the first phase ST_PH1_ON of switching-on of the semiconductor switch, actuation of the second driver switch by the third preset actuation current and starting of a first time measurement at the beginning of the first phase ST_PH1_ON of switching-on in order to determine a first duration in the case of an identified, directly preceding first type of signal edge in the control signal takes place. The first time measurement is in this case continued as long as the presently measured control connection voltage does not exceed the reference control voltage.

If the presently measured control connection voltage does not exceed the reference control voltage and the determined first duration exceeds a first preset maximum duration, the second driver switch is switched off and the first driver switch is actuated by the second preset actuation current, as is illustrated schematically with a transition 1 in FIG. 1. In this case, there is therefore a transition from the first phase ST_PH1_ON of switching-on to the second phase ST_PH2_OFF of switching-off of the semiconductor switch.

If, on the other hand, the presently measured control connection voltage exceeds the reference control voltage and the determined, first duration does not exceed the first preset maximum duration in the process, a transition 2 (illustrated schematically in FIG. 1) from the first phase ST_PH1_ON of switching-on to the second phase ST_PH2_ON of the switching-on of semiconductor switch takes place.

In the second phase ST_PH2_ON, actuation of the second driver switch by the fourth actuation current, ending of the first time measurement and starting of a second time measurement at the beginning of the second phase of switching-on in order to determine a second duration takes place. The second time measurement is continued as long as the presently measured input connection voltage does not fall below the reference input voltage.

If the presently measured input connection voltage does not fall below the reference input voltage and the determined second duration exceeds a second preset maximum duration, the second driver switch is switched off and the first driver switch is actuated by the fifth preset actuation current, as is illustrated schematically in FIG. 1 with a transition 3 to a fault state ST_UCE_FAIL.

In the second phase of switching-on, the first time measurement is continued in the embodiment shown if the presently measured control connection voltage falls below the reference control voltage again. If the determined first duration in this case exceeds the first preset maximum duration, the second driver switch is switched off and the first driver switch is actuated by the second preset actuation current, as is illustrated schematically in FIG. 1 with a transition 4. Therefore, in this case there is a transition from the second phase ST_PH2_ON of switching-on to the second phase ST_PH2_OFF of switching-off of the semiconductor switch.

If the presently measured input connection voltage falls below the reference input voltage and the determined second duration does not exceed the second preset maximum duration, a transition (illustrated schematically in FIG. 1) from the second phase ST_PH2_ON of switching-on to the third phase ST_PH3_ON of switching-on of the semiconductor switch takes place.

In the third phase ST_PH3_ON of switching-on of the semiconductor switch, actuation of the second driver switch by the second preset actuation voltage and ending of the second time measurement takes place. In this case, in the third phase ST_PH3_ON of switching-on, the input connection voltage is measured repeatedly, filtered and compared with the reference input voltage. If the repeatably measured, filtered input connection voltage exceeds the reference input voltage, the second driver switch is switched off and the first driver switch is actuated by the fifth preset actuation current, as is illustrated schematically in FIG. 1 by a transition 6 to the fault state ST_UCE_FAIL.

The first driver switch is in this case actuated by the fifth preset actuation current for a fifth preset duration. Once the fifth preset duration has been reached, the control connection voltage is measured repeatedly and compared with the reference control voltage.

If the repeatedly measured control connection voltage does not fall below the reference control voltage once the fifth preset duration has been reached, a fault state ST_ERR_OFF is identified, as is illustrated schematically in FIG. 1 by a transition 7, and the control connection is coupled or electrically connected to the negative supply voltage connection via an electrical resistor. Therefore, a redundant safety switch is activated, which is intended to forcibly bring about discharge of the control connection via an independent path. Thereupon, the following switch-on pulse of the pulse-width-modulated control signal is ignored in order to increase the probability of discharge of the control connection without destruction of the semiconductor switch. If a directly preceding second type of signal edge is then identified in the control signal, the first driver switch is actuated by the first preset actuation voltage, as is illustrated schematically in FIG. 1 by a transition 8. There is therefore a transition to the third phase ST_PH3_OFF of switching-off of the semiconductor switch.

If the repeatedly measured control connection voltage does not exceed the reference control voltage, on the other hand, a fault state ST_PH3_ERR is identified, as is illustrated schematically in FIG. 1 by a transition 9. If in this fault state a directly preceding second type of signal edge in the control signal is additionally identified, the first driver switch is actuated by the first preset actuation voltage, as is illustrated schematically in FIG. 1 by a transition 10. In this case there is therefore a transition from the fault state ST_PH3_ERR to the third phase ST_PH3_OFF of switching-off of the semiconductor switch.

In the third phase ST_PH3_ON of switching-on, in addition the first time measurement is continued if the presently measured control connection voltage falls below the reference control voltage again. If in this case the determined first duration exceeds the first preset maximum duration, the second driver switch is switched off and the first driver switch is actuated by the second preset actuation current, as is illustrated schematically in FIG. 1 by a transition 11. There is therefore a transition from the third phase ST_PH3_ON of switching-on to the second phase ST_PH2_OFF of switching-off of the semiconductor switch.

In the case of an identified, directly preceding second type of signal edge in the control signal, in the embodiment of the method shown, a transition 12 (illustrated schematically in FIG. 1) from the third phase ST_PH3_ON of switching-on to the first phase ST_PH1_OFF of switching-off of the semiconductor switch takes place. In the first phase ST_PH1_OFF of switching-off of the semiconductor switch, actuation of the first driver switch by the first preset actuation current and starting of a third time measurement at the beginning of the first phase ST_PH1_OFF of switching-off in order to determine a third duration takes place.

The third time measurement is continued as long as the presently measured control connection voltage does not fall below the reference control voltage. If the determined third duration exceeds a third preset maximum duration and the presently measured input connection voltage does not exceed the reference input voltage, again the fault state ST_ERR_OFF is identified, as is illustrated schematically in FIG. 1 by a transition 13, and the control connection is coupled to the negative supply voltage connection via the electrical resistor. Thereupon, the following switch-on pulse of the pulse-width-modulated control signal is ignored in order to increase the probability of discharge of the control connection without destruction of the semiconductor switch. If a directly preceding second type of signal edge in the control signal is then identified, the first driver switch is actuated by the first preset actuation voltage, as is illustrated schematically in FIG. 1 by a transition 14. Therefore, in this case there is a transition to the third phase ST_PH3_OFF of switching-off of the semiconductor switch.

When the reference input voltage is exceeded by the presently measured input connection voltage, a transition 15 (illustrated schematically in FIG. 1) from the first phase ST_PH1_OFF of switching-off to the second phase ST_PH2_OFF of switching-off of the semiconductor switch takes place. In the second phase ST_PH2_OFF of switching-off of the semiconductor switch, in this case actuation of the first driver switch by the second preset actuation current and starting of a fourth time measurement at the beginning of the second phase of switching-off of the semiconductor switch in order to determine a fourth duration takes place.

The fourth time measurement is continued as long as the presently measured control connection voltage does not fall below the reference control voltage. If the presently measured control connection voltage does not fall below the reference control voltage and the determined fourth duration exceeds a fourth preset maximum duration or if the determined third duration exceeds the third preset maximum duration and the presently measured input correction voltage exceeds the reference input voltage, in turn the fault state ST_ERR_OFF is identified, as is illustrated schematically in FIG. 1 by a transition 16, and the control connection is coupled to the negative supply voltage connection via the electrical resistor. Thereupon, the following switch-on pulse of the pulse-width-modulated control signal is ignored in order to increase the probability of discharge of the control connection without destruction of the semiconductor switch. If a directly preceding second type of signal edge in the control signal is then identified, the first driver switch is actuated by the first preset actuation voltage, as is illustrated schematically in FIG. 1 by the transition 14. Therefore, in this case there is a transition to the third phase ST_PH3_OFF of switching-off of the semiconductor switch.

If, on the other hand, the presently measured control connection voltage falls below the reference control voltage and in this case the determined third duration does not exceed the third preset maximum duration and the determined fourth duration does not exceed the fourth preset maximum duration, a transition 17 (illustrated schematically in FIG. 1) from the second phase ST_PH2_OFF of switching-off to the third phase ST_PH3_OFF of switching-off of the semiconductor switch takes place. In the third phase ST_PH3_OFF of switching-off of the semiconductor switch, in this case actuation of the first driver switch by the first preset actuation voltage takes place.

In the case of an identified, directly preceding first type of signal edge in the control signal, in the embodiment of the method shown, a transition 18 (illustrated schematically in FIG. 1) from the third phase ST_PH3_OFF of switching-off to the first phase ST_PH1_ON of switching-on of the semiconductor switch takes place.

In the embodiment shown, the fault-free switching profile provided is therefore formed by in each case three charging and discharge phases. The state transitions are in this case triggered during normal operation exclusively by switching edges of a pulse-width-modulated control signal and signals of comparison units, for example in the form of gate and collector comparator signals, as will be explained further below. In order to achieve a high degree of error robustness, in the embodiment shown complex monitoring and fault response mechanisms are defined, which, depending on the fault case, intervene in the direct switching path or demand, via an additional safety path, disconnection of the semiconductor switch.

The switching phases are temporally monitored by means of configurable timers. When a respective timer threshold is exceeded, a monitored disconnection of the semiconductor switch is initiated depending on the present switching state. If this disconnection, which is likewise monitored temporally, is unrewarding, a redundant safety switch is activated, which is intended to forcibly bring about discharge of the control connection via an independent path.

The method shown therefore enables a greater degree of fault robustness and reliability. The monitoring of the switching behavior and the management of faults increases the reliability of the system by reducing the probability of failure of the semiconductor switch. In addition, safety requirements for safety-relevant electrical or electronic systems can be met, in particular in vehicle applications. In addition, extended diagnosis possibilities are provided. In this case, detailed information on the causes of the detected faults make it easier to eliminate faults and to develop fault-robust systems.

In the embodiment shown, the semiconductor switch, as already explained, is an n-channel IGBT or an n-channel MOSFET. However, the method can similarly be applied to a p-channel IGBT or a p-channel MOSFET, wherein in particular the value of the reference control voltage is matched correspondingly.

FIG. 2 shows a drive apparatus AV for driving an electric or hybrid vehicle (not illustrated in any more detail in FIG. 2) comprising an electric machine EM and a power converter SR in a schematic illustration in accordance with one embodiment.

The electric machine EM is mechanically coupled to a drive shaft (not illustrated in any more detail in FIG. 2) of the vehicle for torque transmission and is used for propulsion of the vehicle.

The power converter SR is used for providing phase currents Ip for the electric machine EM and has a triple half-bridge circuit DHS, in each case having a high-side and a low-side semiconductor switch HS1 and HS2, HS3 and HS4 or HS5 and HS6, in a series circuit. Each of the six semiconductor switches HS1 to HS6 has in each case one input current connection EHS, an output current connection AHS and, between the input current connection EHS and the output current connection AHS, a load path for passing through a load current from the input current connection EHS to the output current connection AHS and then to the electric machine EM as phase current Ip. In addition, the semiconductor switches HS1 to HS6 each have a control connection SHS, via which the respective semiconductor switch HS1 to HS6 is actuated in order to enable, in the switched-on state of the respective semiconductor switch, the throughflow of the load current through the load path or, in the switched-off state of the respective semiconductor switch, to block the throughflow of the load current through the load path. The semiconductor switches HS1 to HS6 are n-channel IGBTs in the embodiment shown.

For each of these six semiconductor switches HS1 to HS6, the power converter SR has in each case one circuit arrangement SA1, SA2, SA3, SA4, SA5 and SA6, respectively, for controlling the respective semiconductor switch HS1 to HS6, wherein the six circuit arrangements SA1 to SA6 are largely functionally identical to one another. In order to simplify the description of the drive apparatus AV, only one of the six circuit arrangements SA1 to SA6 is described in detail below.

As is the case for the remaining five circuit arrangements SA2 to SA6, the first circuit arrangement SA1 has a driver circuit unit in the form of a half-bridge circuit unit HB, a first comparison unit VE1, a second comparison unit VE2, a memory unit SE and an actuation unit AE. The circuit arrangement SA1 is formed in an ASIC component part, with the exception of the half-bridge circuit unit HB. This enables a considerable reduction in the number of component parts and the costs involved for the component parts, requires less space on the printed circuit board and results in lower production costs, in particular for the storage, populating and testing of the components. In addition, additional functionalities can be integrated. In addition, increased switching speeds can thus be set, a greater degree of reliability and increased robustness with respect to EMC interference are enabled and the diagnosis possibilities extended.

The half-bridge circuit unit HB for its part has in each case one first controllable driver switch T1, which is arranged between the control connection SHS of the semiconductor switch HS1 and a first negative supply voltage connection NA, and a second controllable driver switch T2, which is arranged between the control connection SHS of the semiconductor switch HS1 and a second, positive supply voltage connection HA, in a series circuit, wherein the node between the two driver switches T1 and T2 which connects these two driver switches T1 and T2 to one another is electrically connected to the control connection SHS of the semiconductor switch HS1 of the triple half-bridge circuit DHS. As a result, the semiconductor switch HS1 of the triple half-bridge circuit DHS is switched, controlled by this half-bridge circuit unit HB. The driver switches T1 and T2 in the embodiment shown are semiconductor switches in the form of MOSFETs.

The first comparison unit VE1 has a first and a second input connection E11, E12 and an output connection A11 and is electrically connected to the input current connection EHS of the semiconductor switch HS1 via the first input connection E11. Via this first input connection E11, the first comparison unit VE1 measures the voltage potential UE at the input current connection EHS of the semiconductor switch HS1. Via the second input connection E12, the first comparison unit VE1 receives a first reference voltage potential UE_TH from a unit (not illustrated in any more detail). The first comparison unit VE1 compares the measured voltage potential UE with the reference voltage potential UE_TH and, depending on the comparison result, outputs an output signal at the output connection A11, which output signal is transmitted to an actuation unit AE of the circuit arrangement SA1.

The second comparison unit VE2 has a first and a second input connection E21, E22 and an output connection A21 and is electrically connected to the control connection SHS of the semiconductor switch HS1 via the first input connection E21. Via this first input connection E21, the second comparison unit VE2 measures the voltage potential US at the control connection SHS of the semiconductor switch HS1. Via the second input connection E22, the second comparison unit VE2 receives a second reference voltage potential US_TH from a unit (not illustrated in any more detail). The second comparison unit VE2 compares the measured voltage potential US with the reference voltage potential US_TH and, depending on the comparison result, outputs an output signal at the output connection A21, which output signal is transmitted to the actuation unit AE of the circuit arrangement SA1.

The first comparison unit VE1 and the second comparison unit VE2 are typically each in the form of a comparator.

The actuation unit AE is designed for actuating the semiconductor switch HS1 by controlled, phase-based switching-on and switching-off of the two driver switches T1 and T2 using a pulse-width-modulated control signal PWM, which is provided by a central actuation unit (not illustrated in any more detail), and in particular using rising signal edges SSF and falling signal edges FSF of the pulse-width-modulated control signal PWM. For this purpose, the control connection SHS of the semiconductor switch HS1 is discharged by the first preset actuation current IAS1, the second preset actuation current IAS2 or the fifth preset actuation current IAS5 and is charged by the third preset actuation current IAS3 or the fourth preset actuation current IAS4. In addition, the control connection SHS can be switched fixedly, via the driver switch T2, to the voltage of the second, positive supply voltage connection HA or, via the driver switch T1, fixedly to the voltage of the first, negative supply voltage connection NA. The voltage present at the second, positive supply voltage connection HA therefore in this case corresponds to the second preset actuation voltage and the voltage present at the first, negative supply voltage connection NA corresponds to the first preset actuation voltage.

In addition, the circuit arrangement SA1 has a time measurement unit ZME, for example in the form of a clock generator or an oscillator, for starting a time measurement at the beginning of the first and second phases of the phase-based switching-on and at the beginning of the first and second phases of the phase-based switching-off of the semiconductor switch HS1 in order to determine corresponding durations, wherein the time measurements take place as described in connection with FIG. 1. Furthermore, the circuit arrangement SA1 has a third comparison unit VE3 for comparing the determined durations with respective preset maximum durations, as has likewise been described in more detail in connection with FIG. 1. The actuation unit AE is designed to actuate the semiconductor switch HS1 by means of the two driver switches T1 and T2 in such a way that the semiconductor switch HS1 is switched in each case to a preset operating state if the corresponding determined duration exceeds the associated preset maximum duration, as explained in connection with FIG. 1. In addition, the control connection SHS can be coupled to the negative supply voltage connection NA via an electrical resistor R1 in the case of the fault state ST_ERR_OFF described in FIG. 1 by closing a switch S.

The mentioned actuation currents IAS1 to IAS5 and the preset maximum durations are stored in a memory unit SE of the circuit arrangement SA1 in the embodiment shown.

As the basis for the actuation and monitoring of the switching phases, in this case a two-fold concept is used, which is implemented as digital logic.

A direct path enables the implementation of the PWM switching commands from the central actuation unit (not illustrated in any more detail) as quickly as possible and response to the, for example, gate and collector comparator signals of the semiconductor switch HS1. By virtue of the implementation by means of purely combinatorial logic, in addition jitter-free switching behavior is achieved and approximate congruent switching cycles are generated. This enables quick and low-loss semiconductor switch actuation. The input signals are clock synchronized over a parallel path, and the temporally correct sequence of said input signals is monitored, for example, by a clocked automatic state device and coupled timer modules.

The central actuation unit (not illustrated in any more detail) identifies the fault case on the basis of the status feedback and initiates the corresponding response on a system level. The automatic state device monitors the correct management of the faults and thereupon enables renewed switch-on of the semiconductor switch HS1. In addition, precise information on the respective fault image can be fed back via a diagnosis line (not illustrated in any more detail). This diagnosis information facilitates the management of faults and the development of a fault-robust system.

In addition, feedback of the respective collector comparator state can take place via a status line (not illustrated in any more detail), which is monitored by the central actuation unit.

What is claimed is:

1. A method for actuating a controllable semiconductor switch using a control signal by controlled, stepwise switching-on and switching-off, the method comprising:
  starting a time measurement at a beginning of at least one step of the stepwise switching-on and switching off to determine a duration, wherein the time measurement is continued until a beginning of step following the at least one step of the stepwise switching-on and switching off, comparing the determined duration with a preset maximum duration, and in response to determining that the determined duration exceeds the preset maximum duration, actuating the semiconductor switch such that the semiconductor switch is switched into a preset operating state.

2. The method as claimed in claim 1, wherein:

the semiconductor switch comprises a control connection, an input current connection, and an output current connection and is controllable via the control connection, wherein the control signal is a pulse-width-modulated control signal, wherein the actuation of the semiconductor switch additionally is performed by a driver circuit unit, wherein the driver circuit unit comprises:
  a first controllable driver switch arranged between the control connection of the semiconductor switch and a first, negative supply voltage connection, and
  a second controllable driver switch is arranged between the control connection of the semiconductor switch and a second, positive supply voltage connection, and wherein the method further comprises:
  identifying a first type or a second type, which is different than the first type, of signal edge in the control signal,
  measuring an input connection voltage at the input current connection of the semiconductor switch,
  comparing the measured input connection voltage with a reference input voltage,
  measuring a control connection voltage at the control connection of the semiconductor switch, and
  comparing the measured control connection voltage with a reference control voltage,
  wherein actuation of the semiconductor switch is performed by controlled, stepwise switching-on and switching-off of the first driver switch and the second driver switch depending on at least one of:
    (a) the identified, first type or second type of signal edge in the control signal,
    (b) the comparison result between the presently measured input connection voltage and the reference input voltage, and/or
    (c) the comparison result between the presently measured control connection voltage and the reference control voltage.

3. The method of claim 2, wherein the actuation of the semiconductor switch is performed by controlled, stepwise switching-on and switching-off of the first driver switch and the second driver switch optionally with using a first preset actuation voltage, a second preset actuation voltage, a first preset actuation current, a second preset actuation current independent of the first preset actuation current, a third preset actuation current, a fourth preset actuation current independent of the third preset actuation current, or a fifth preset actuation current that is lower than the first preset actuation current and the second preset actuation current.

4. The method of claim 3 comprising:

in a first step of switching-on of the semiconductor switch, actuating the second driver switch with the third preset actuation current and starting a first time measurement at the beginning of the first step of switching-on to determine a first duration in the case of an identified, first type of signal edge in the control signal, continuing the first time measurement as long as the presently measured control connection voltage does not exceed the reference control voltage, and in response to the determined first duration exceeding a first preset maximum duration, switching off the second driver switch and actuating the first driver switch by the second preset actuation current.

5. The method of claim 4, comprising:

in a second step of switching-on of the semiconductor switch, actuating the second driver switch by the fourth preset actuation current and starting a second time measurement at the beginning of the second step of switching-on to determine a second duration in the event of the reference control voltage being exceeded by the presently measured control connection voltage, and continuing the second time measurement as long as the presently measured input connection voltage does not fall below the reference input voltage, and in response to the determined second duration exceeding a second preset maximum duration, switching off the second driver switch and actuating the first driver switch by the fifth preset actuation current.

6. The method of claim 5, comprising:

in the second step of switching-on, continuing the first time measurement if the presently measured control connection voltage falls below the reference control voltage again, and in response to the determined first duration exceeding the first preset maximum duration, switching off the second driver switch and actuating the first driver switch by the second preset actuation current.

7. The method of claim 5, comprising:

in a third step of switching-on of the semiconductor switch, actuating the second driver switch by the second preset actuation voltage in the event that the presently measured input connection voltage falls below the reference input voltage, in the third step of switching-on, measuring the input connection voltage repeatedly and comparing the measured input connection voltage with the reference input voltage, and in response to the repeatedly measured input connection voltage exceeding the reference input voltage, switching off the second driver switch and switching off the first driver switch by the fifth preset actuation current.

8. The method of claim 7, comprising:

in the third step of switching-on, continuing the first time measurement if the presently measured control connection voltage falls below the reference control voltage again, and in response to the determined first duration exceeding the first preset maximum duration, switching off the second driver switch and actuating the first driver switch by the second preset actuation current.

9. The method of claim 5, comprising actuating the first driver switch by the fifth preset actuation current for a fifth preset duration, and once the fifth preset duration has been reached, measuring the control connection voltage repeatedly and comparing the measured control connection voltage with the reference control voltage.

10. The method of claim 9, further comprising:
coupling the control connection to the negative supply voltage connection via an electrical resistor if the repeatedly measured control connection voltage does not fall below the reference control voltage once the fifth preset duration has been reached, and
actuating the first driver switch by the first preset actuation voltage if the repeatedly measured control connection voltage does not exceed the reference control voltage and, in addition, a second type of signal edge is identified in the control signal.

11. The method of claim 3, comprising:
in a first step of switching-off of the semiconductor switch, actuating the first driver switch by the first preset actuation current and starting a third time measurement at the beginning of the first step of switching-off to determine a third duration in the case of an identified, second type of signal edge in the control signal,
continuing the third time measurement as long as the presently measured control connection voltage does not fall below the reference control voltage, and,
in response to the determined third duration exceeding a third preset maximum duration, coupling the control connection to the negative supply voltage connection via an electrical resistor.

12. The method of claim 11, comprising:
in a second step of switching-off of the semiconductor switch, actuating the first driver switch by the second preset actuation current and starting a fourth time measurement at the beginning of the second step of switching-off of the semiconductor switch to determine a fourth duration in the event that the reference input voltage is exceeded by the presently measured input connection voltage,
continuing the fourth time measurement as long as the presently measured control connection voltage does not fall below the reference control voltage, and
in response to the determined fourth duration exceeding a fourth preset maximum duration, coupling the control connection to the negative supply voltage connection via an electrical resistor.

13. The method of claim 12, further comprising, in a third step of switching-off of the semiconductor switch, actuating the first driver switch by the first preset actuation voltage in the event of the presently measured control connection voltage falling below the reference control voltage.

14. A circuit arrangement for actuating a controllable semiconductor switch using a control signal, the circuit arrangement comprising:
an actuation unit configured to actuate the semiconductor switch by controlled, stepwise switching-on and switching-off,
a time measurement unit configured to start a time measurement at a beginning of at least one step of the stepwise switching-on and switching-off to determine a duration, wherein the time measurement is continued until a beginning of a step following the at least one step of the stepwise switching-on and switching-off, and
a comparison unit configured to compare the determined duration with a preset maximum duration,
wherein the actuation unit is configured to actuate the semiconductor switch such that the semiconductor switch is switched to a preset operating state in response to the determined duration exceeding the preset maximum duration.

15. The circuit arrangement of claim 14, wherein:
the semiconductor switch comprises a control connection, an input current connection and an output current connection and is controllable via the control connection, and
the control signal is a pulse-width-modulated control signal, and
the circuit arrangement additionally comprises:
a driver circuit unit having at least one controllable driver switch,
a first comparison unit configured to measure an input connection voltage at the input current connection of the semiconductor switch and to compare the measured input connection voltage with a reference input voltage,
a second comparison unit configured to measure a control connection voltage at the control connection of the semiconductor switch and to compare the measured control connection voltage with a reference control voltage, and
wherein the actuation unit is configured to actuate the semiconductor switch by controlled, stepwise switching-on and switching-off of the at least one driver switch.

* * * * *